(12) United States Patent
Vyers et al.

(10) Patent No.: US 9,880,569 B2
(45) Date of Patent: Jan. 30, 2018

(54) PRESSURE CONTROL METHOD FOR PROCESS CHAMBER AND PRESSURE CONTROL DEVICE FOR PROCESS CHAMBER

(71) Applicant: PROGRESSIO LLC, Chiba (JP)

(72) Inventors: Emmanuel Vyers, Chiba (JP); Mie Kimura, Chiba (JP)

(73) Assignee: PROGRESSIO LLC, Funabashi-Shi, Chiba (JP)

( * ) Notice: Subject to any disclaimer, the term of this patent is extended or adjusted under 35 U.S.C. 154(b) by 642 days.

(21) Appl. No.: 14/547,752

(22) Filed: Nov. 19, 2014

(65) Prior Publication Data
US 2015/0142185 A1    May 21, 2015

(30) Foreign Application Priority Data

Nov. 20, 2013   (JP) .................................. 2013-240312

(51) Int. Cl.
G05D 7/00       (2006.01)
G05D 16/20      (2006.01)
C23C 16/455     (2006.01)
C23C 14/54      (2006.01)

(52) U.S. Cl.
CPC ......... *G05D 16/2066* (2013.01); *C23C 14/54* (2013.01); *C23C 16/45557* (2013.01)

(58) Field of Classification Search
CPC ................................................ G05D 16/2066
USPC ....................................................... 700/282
See application file for complete search history.

(56) References Cited

U.S. PATENT DOCUMENTS

| 5,577,707 | A   | 11/1996 | Brida |
| 6,237,692 | B1* | 5/2001 | Averhoff ................... F04F 1/08 166/105 |
| 7,254,476 | B2* | 8/2007 | Kassner ................ F02D 35/023 701/114 |
| 7,369,920 | B2  | 5/2008 | Davidkovich et al. |
| 7,490,795 | B2* | 2/2009 | Clegg .................... B64D 25/14 137/587 |
| 7,885,783 | B2* | 2/2011 | Kurosawa ............. F17C 13/025 702/138 |

(Continued)

FOREIGN PATENT DOCUMENTS

| JP | 3-171306 A  | 12/1996 |
| JP | H09178000 A | 7/1997 |

(Continued)

*Primary Examiner* — Evral E Bodden
(74) *Attorney, Agent, or Firm* — Pearne & Gordon LLP

(57) ABSTRACT

A predicted outflow rate (Qo) at which gas is discharged from a process chamber 2 via a vacuum pump 3 is computed, and an input flow rate (Qi) is calculated in order to reach a preset target pressure (Psp). The input flow rate (Qi) is calculated, on the basis of the expression $Qi=Qo+(\Delta P/\Delta t)V$, from a known volume (V) of the process chamber 2 and a pressure change rate ($\Delta P/\Delta t$) obtained from the current pressure ($P_1$) within the process chamber 2 to reach the target pressure (Psp). A current predicted outflow rate (Qo) is estimated on the basis of the expression $Qo(n)=P_2 * f_1(P_2)$, from the current pressure ($P_2$) within the vacuum pump 3 and a known characteristic pumping rate ($Sp=f_1(P_2)$) of the vacuum pump 3 under preset pressure.

18 Claims, 7 Drawing Sheets

(56) References Cited

U.S. PATENT DOCUMENTS

| | | | |
|---|---|---|---|
| 2007/0225870 A1 | 9/2007 | Davidkovich et al. | |
| 2008/0183340 A1* | 7/2008 | Kofuji | G05D 16/2073 700/301 |
| 2017/0199068 A1* | 7/2017 | Abate | G01F 22/00 |

FOREIGN PATENT DOCUMENTS

| | | | |
|---|---|---|---|
| JP | 5087073 A | 8/2009 | |
| JP | 2009530737 A | 8/2009 | |
| JP | 4630994 B1 | 2/2011 | |
| JP | 2011117488 B1 | 2/2011 | |

* cited by examiner

US 9,880,569 B2

1

PRESSURE CONTROL METHOD FOR PROCESS CHAMBER AND PRESSURE CONTROL DEVICE FOR PROCESS CHAMBER

TECHNICAL FIELD OF THE INVENTION

The present invention relates to improvements to a method for controlling pressure in a process chamber and to a device for controlling pressure in a process chamber, intended for use, for example, in process chambers of various types for semiconductor devices, in order to regulate the pressure within the process chamber to a preset target value (pressure setpoint).

PRIOR ART OF THE INVENTION

In production operations for semiconductor devices, it is common practice to control the pressure of various source gas and the like introduced into etching devices or into process chambers of various types, for carrying out processes such as thin film processes involving chemical vapor deposition (CVD), PVD, or other processes, so that the pressure is brought to a preset target value (pressure setpoint), preventing scatter of particles or the like due to pressure overshoot.

It has been proposed, when controlling pressure within a process chamber, to install a variable conductance valve between the process chamber and the vacuum pump, and to regulate the opening position (aperture) of the variable conductance valve in order to regulate the pressure within the process chamber to a preset value (for example, see Japanese Unexamined Patent Application Publication (Translation of PCT Application) 2009-530737. Japanese Patent Publication 5087073, and Japanese Unexamined Patent Application Publication 3-171306).

In more specific terms, it has been proposed to provide the system with a pressure sensor configured to measure the pressure of the fluid in the chamber, a valve configured to regulate the flow of the fluid from the process chamber by moving between an open position and a closed position, and a controller configured to generate a pump speed curve of the valve, wherein the pump speed curve represents the pump speed C (L (liters)/sec) of the system, which is controlled by the valve and which is a function of the valve position; the controller is configured to monitor and modify the pump speed curve so as to maintain the slope of the pump speed curve at least a minimum value; the controller is further configured to employ the modified pump speed curve in order to regulate the valve position in response to pressure measurements by the pressure sensor, so as to maintain pressure within the process chamber at the desired pressure setpoint; and the controller is further configured to estimate a volume of the process chamber, and to generate the pump speed curve using the estimated volume together with pressure measurements made by the pressure sensor at a plurality of positions of the valve (see Japanese Patent Publication 5087073).

That is, according to this prior art technique, through a process of learning pump speed at each aperture of the valve, it is attempted to maintain pressure at a preset value by maintaining the slope of the pump speed curve at at least a minimum value, i.e. through approximation of a constant value. However, this prior art technique requires ongoing monitoring and modification of the pump speed curve, therefore making it necessary to operate the system once with dummy wafers to make the system learn each combination of process chamber type and vacuum pump or valve, prior to running the system; as well as to reset the curve each time that these combinations change. The system therefore lacks practicality, and has the problem that considerable time and labor are required for making settings before the system can be run.

Moreover, this prior art technique involves deriving the pump speed curve from the estimated volume of the process chamber and the measured pressure of the fluid within the process chamber. In actual practice, in many instances, the volume of the process chamber is known, whereas on the other hand, in the case of gas such a source gas, the pump speed of the vacuum pump is known to be affected by the pressure of fluid within the vacuum pump, as shown in FIG. 5 and FIG. 7. Consequently, while it would be preferable to take into account this pressure of gas within the vacuum pump, by estimating the gas outflow rate and calculating the inflow rate needed to maintain the pressure at a preset constant value, this pressure of gas within the vacuum pump is not taken into account in any of the prior art techniques, and there is the additional problem that pressure of gas inside a vacuum pump is not always easy to measure.

Moreover, the characteristic pumping rate (L/s) observed when this vacuum pump is at preset pressure, and the characteristic conductance (L/s) of the valve observed with the gate of the valve at a given aperture, differ by each vacuum pump and valve maker, and by product (size), and therefore the process of calculating the necessary inflow rate on the basis of pressure of gas within the vacuum pump in order to control pressure within the process chamber requires the operator to input characteristic values for each product, for each combination of valve and vacuum pump, posing the risk that even simple regulation will be difficult.

With the foregoing in view, an object of the present invention is to provide a method for controlling pressure in a process chamber, whereby pressure of gas inside a process chamber can be accurately regulated to a preset target value, and which can easily and rapidly be adapted to various combinations of process chambers, vacuum pumps, and valves; and a device for controlling pressure in a process chamber, which can be used in the method.

SUMMARY OF THE INVENTION (1. Pressure Control Method)

The present invention according to a first aspect for solving the aforedescribed problem provides a pressure control method for regulating the pressure of gas inside a process chamber in a semiconductor production step via a valve situated between the process chamber and a vacuum pump for suctioning gas from within the process chamber, wherein the method for controlling pressure in a process chamber is characterized in that a predicted outflow rate (Qo) at which gas is discharged from the process chamber via the vacuum pump by the suction of the vacuum pump is computed; an input flow rate (Qi) at which it is necessary for gas to flow into the process chamber in order to reach a preset target pressure (Psp) within the process chamber is calculated on the basis of the expression $Qi = Qo + (\Delta P/\Delta t)V$ using a known volume (V) of the process chamber and a pressure change rate ($\Delta P/\Delta t$) obtained from the current pressure ($P_1$) within the process chamber to reach the target pressure (Psp), the rate being derived from the differential between the current pressure ($P_1$) and the target pressure (Psp); and when the pressure within the process chamber is controlled to the target pressure (Psp) by flowing inflow of the calculated input flow rate (Qi) into the process chamber, a current predicted outflow rate Qo(n) at which gas is discharged from the process chamber is calculated on the basis of the expression $Qo(n)=P_2 \ast f_1(P_2)$, using a current pressure ($P_2$) within the vacuum pump and a known characteristic pumping rate ($Sp=f_1(P_2)$) of the vacuum pump under preset pressure wherein the following terms used herein are defined as follows;

"$P_1$": the current gas pressure within the process pump;
"$P_2$": the current gas pressure within the vacuum chamber;
"$\Delta t$": a specific time increment;
"$\Delta P$": the change in pressure in a specific time increment;
"n": the discrete index of the term, for example "n" describes an instant in time and (n+1) describes the next instant in time; and
"$f_1$": the characteristic pumping speed at the pump as a function of pump inlet pressure.

The present invention according to a second aspect for solving the aforedescribed problem provides a method for controlling pressure in a process chamber according to the first aspect, characterized in that the current pressure ($P_2$) within the vacuum pump is calculated using the expression $P_2=P_1(Qo(n-1)/f_2(\theta))$, from a known characteristic conductance ($Cv=f_2(\theta)$) of the valve at the opening/closing angle ($\theta$) associated with the current position of the gate of the valve; and the current predicted outflow rate Qo(n) at which gas is discharged from the process chamber is calculated, wherein the term "$f_2(\theta)$" used herein is defined as the characteristic conductance of the valve as a function at opening/closing angle ($\theta$).

The present invention according to a third aspect for solving the aforedescribed problem provides a method for controlling pressure in a process chamber according to the second aspect, characterized in that the calculated current predicted outflow rate Qo(n) of gas is fed back by being re-inputted in the form of the term Qo(n−1) in the expression $P_2=P_1-(Qo(n-1)/f_2(\theta))$ used to derive the current pressure ($P_2$) within the vacuum pump; the $P_2$ thusly calculated is then substituted for the terms $P_2$ and $f_1(P_2)$ in the expression $Qo(n)=P_2 \ast f_1(P_2)$ used to derive the predicted current outflow rate of gas discharged from the process chamber, whereby the current predicted outflow rate Qo(n) of gas is calculated; and the input flow rate (Qi) at which it is necessary for gas to flow into the process chamber to reach the target pressure (Psp) is calculated constantly, according to change in the current pressure ($P_2$) within the vacuum pump.

The present invention according to a fourth aspect for solving the aforedescribed problem provides a method for controlling pressure in a process chamber according to the first aspect, characterized in that the current pressure ($P_2$) within the vacuum pump is derived through measurements made by a sensor situated in the vacuum pump.

The present invention according to a fifth aspect for solving the aforedescribed problem provides a method for controlling pressure in a process chamber according to any of the first to fourth aspects, characterized in that the gate is displaced to a position equivalent to a preset opening/closing angle ($\theta$), to obtain a specific conductance (Cv) necessary for the valve to ensure the input flow rate (Qi), and the pressure within the process chamber is controlled to the target pressure (Psp).

The present invention according to a sixth aspect for solving the aforedescribed problem provides a method for controlling pressure in a process chamber according to any of the first to fifth aspects, characterized in that a characteristic conductance ($Cv=f_2(\theta)$) of the valve at the opening/closing angle ($\theta$) associated with the current position of the gate of the valve is stored in advance, for each class of the valves; a characteristic pumping rate ($Sp=f_1(P_2)$) of the vacuum pump at preset pressure is stored in advance, for each class of the vacuum pumps; and the current predicted outflow rate Qo(n) at which gas is discharged from the process chamber is calculated.

The present invention according to a seventh aspect for solving the aforedescribed problem provides a method for controlling pressure in a process chamber according to the sixth aspect, characterized in that the inputted characteristic pumping rate ($Sp=f_1(P_2)$) of the vacuum pump is switched in accordance with the class of the vacuum pump, and the inputted characteristic conductance ($Cv=f_2(\theta)$) of the valve at the opening/closing angle ($\theta$) associated with the current position of the gate of the valve is switched in accordance with the class of the valve.

The present invention according to an eighth aspect for solving the aforedescribed problem provides a method for controlling pressure in a process chamber according to any of the first to seventh aspects, characterized in that the valve is a vacuum valve such as a gate valve, pendulum valve, butterfly valve, or poppet valve.

The present invention according to a ninth aspect for solving the aforedescribed problem provides a method for controlling pressure in a process chamber according to any of the first to eighth aspects, characterized in that the valve is a greaseless valve in which the gate is lifted and lowered, within a casing of the valve such as a bellows, by a lifting/lowering member which is contactless with respect to the casing.

(2. Pressure Control Device)

The present invention also provides the pressure control device described below, which can be used as the device for controlling pressure in a process chamber in any of the aforedescribed first to eighth aspects. That is, the present invention according to a tenth aspect for solving the aforedescribed problem provides a device for controlling pressure in a process chamber, for regulating the pressure of gas inside a process chamber in a semiconductor production step, via a valve situated between the process chamber and a vacuum pump for suctioning gas from within the process chamber, the device for controlling pressure in a process chamber characterized by comprising: outflow rate computing means for computing a predicted outflow rate (Qo) at which gas is discharged from the process chamber via the vacuum pump by the suction of the vacuum pump; input flow rate computing means for calculating, on the basis of the expression $Qi=Qo+(\Delta P/\Delta t)V$, an input flow rate (Qi) at which it is necessary for gas to flow into the process chamber in order to reach a predetermined target pressure (Psp) within the process chamber, from a known volume (V) of the process chamber and a pressure change rate ($\Delta P/\Delta t$) obtained from the current pressure ($P_1$) within the process chamber to reach the target pressure (Psp), the rate being derived from the differential between the current pressure ($P_1$) and the target pressure (Psp); and inflow rate regulating means for regulating the inflow rate at which gas is to flow into the process chamber, to the input flow rate (Qi) calculated on the basis of the input flow rate computing means; and when the pressure within the process chamber is controlled to the target pressure (Psp) by flowing inflow of the calculated input flow rate (Qi) into the process chamber, the outflow rate computing means calculates, on the basis of the expression $Qo(n)=P_2 \ast f_1(P_2)$, a current predicted outflow rate Qo(n) at which gas is discharged from the process chamber, from current pressure ($P_2$) within the vacuum pump and a known characteristic pumping rate ($Sp=f_1(P_2)$) of the vacuum pump under preset.

The present invention according to an eleventh aspect for solving the aforedescribed problem provides a device for controlling pressure in a process chamber according to the tenth aspect, characterized in that the outflow rate computing means calculates the current pressure ($P_2$) within the vacuum pump by the expression $P_2=P_1-((Qo(n-1)/f_2(\theta))$, from a known characteristic conductance ($Cv=f_2(\theta)$) of the valve at the opening/closing angle ($\theta$) associated with the current position of the gate of the valve, and calculates the current predicted outflow rate Qo(n) at which gas is discharged from the process chamber.

The present invention according to a twelfth aspect for solving the aforedescribed problem provides a device for controlling pressure in a process chamber according to the eleventh aspect, characterized in that the outflow rate computing means feeds back the calculated current predicted outflow rate Qo(n) of gas through re-inputting thereof in the form of the term Qo(n−1) in the expression $P_2=P_1(Qo(n-1)/f_2(\theta))$; and then substitutes the thusly calculated $P_2$ for the terms P2 and $f_1(P_2)$ in the expression $Qo(n)=P_2*f_1(P_2)$, in order to calculate the current predicted outflow rate Qo(n) of gas; and the input flow rate computing means constantly calculates the input flow rate (Qi) at which it is necessary for gas to flow into the process chamber to reach the target pressure (Psp), according to change in the current pressure ($P_2$) within the vacuum pump, doing so on the basis of the current predicted outflow rate Qo(n) calculated by the outflow rate computing means.

The present invention according to a thirteenth aspect for solving the aforedescribed problem provides a device for controlling pressure in a process chamber according to the tenth aspect, characterized in that the outflow rate computing means derives the current pressure ($P_2$) within the vacuum pump through measurements made by a sensor situated in the vacuum pump.

The present invention according to a fourteenth aspect for solving the aforedescribed problem provides a device for controlling pressure in a process chamber according to any of the tenth to thirteenth aspects, characterized in that the inflow rate regulating means displaces the gate to a position equivalent to a preset opening/closing angle ($\theta$), to obtain a specific conductance (Cv) necessary for the valve to ensure the input flow rate (Qi), and controls the pressure within the process chamber to the target pressure (Psp).

The present invention according to a fifteenth aspect for solving the aforedescribed problem provides a device for controlling pressure in a process chamber according to any of the tenth to fourteenth aspects, characterized in that the outflow rate computing means stores in advance, for each class of the valves, a characteristic conductance ($Cv=f_2(\theta)$) of the valve at the opening/closing angle ($\theta$) associated with the current position of the valve gate; stores in advance, for each class of the vacuum pumps, a characteristic pumping rate ($Sp=f_1(P_2)$) of the vacuum pump at preset pressure; and calculates the current predicted outflow rate Qo(n) at which gas is discharged from the process chamber.

The present invention according to a sixteenth aspect for solving the aforedescribed problem provides a device for controlling pressure in a process chamber according to the fifteenth aspect, characterized by having setting means that can switch the inputted vacuum pump characteristic pumping rate ($Sp=f_1(P_2)$), in accordance with the class of the vacuum pump, and switch the inputted characteristic conductance ($Cv=f_2(\theta)$) of the valve at the opening/closing angle ($\theta$) associated with the current position of the gate of the valve, in accordance with the class of the vacuum pump.

The present invention according to a seventeenth aspect for solving the aforedescribed problem provides a device for controlling pressure in a process chamber according to any of the tenth to the sixteenth aspects, characterized in that the valve is a vacuum valve such as a gate valve, pendulum valve, butterfly valve, or poppet valve.

The present invention according to an eighteenth aspect for solving the aforedescribed problem provides a device for controlling pressure in a process chamber according to any of the tenth to the seventeenth aspects, characterized in that the valve is a greaseless valve in which the gate is lifted and lowered, within a casing of the valve such as a bellows, by a lifting/lowering member which is contactless with respect to the casing.

In the aforedescribed manner, according to the present invention, upon calculation of the current predicted outflow rate (Qo(n)) at which gas is discharged from the process chamber, doing so on the basis of the expression $Qo(n)=P_2*f_1(P_2)$, from the current pressure ($P_2$) within the vacuum pump and the known characteristic pumping rate ($Sp=f_1(P_2)$) of the vacuum pump under preset pressure, the input flow rate (Qi) at which it is necessary for gas to flow into the process chamber in order to reach the target pressure is calculated on the basis of the expression $Qi=Qo+(\Delta P/\Delta t)V$, and inflow of the calculated input flow rate (Qi) into the process chamber is brought about, controlling the pressure within the process chamber to the target pressure (Psp), thereby affording the advantage that the pressure of the gas within the process chamber can be accurately controlled to a preset target value (pressure setpoint).

In this case, in the aforedescribed manner, according to the present invention, the current pressure ($P_2$) within the vacuum pump is calculated using the expression $P_2=P_1(Qo(n-1)/f_2(\theta))$, from the known characteristic conductance ($Cv=f_2(\theta)$) of the valve at the opening/closing angle ($\theta$) associated with the current position of the gate of the valve, and the current predicted outflow rate Qo(n) at which gas is discharged from the process chamber is calculated, thereby affording the advantage that the input flow rate (Qi) at which it is necessary for gas to flow into the process chamber in order to reach the target pressure can be correctly calculated.

At the same time, in the aforedescribed manner, according to the present invention, the calculated current predicted outflow rate Qo(n) of gas is fed back by being re-input in the form of the term Qo(n−1) in the expression $P_2=P_1(Qo(n-1)/f_2(\theta))$ used to derive the current pressure ($P_2$) within the vacuum pump, and the input flow rate (Qi) at which it is necessary for gas to flow into the process chamber to reach the target pressure (Psp) is calculated constantly, according to change in the current pressure ($P_2$) within the vacuum pump, thereby affording the advantage of being able to constantly and instantaneously respond to changes in pressure.

Further, in the aforedescribed manner, according to the present invention, the characteristic conductance ($Cv=f_2(\theta)$) of the valve associated with the opening/closing angle ($\theta$) of the valve at the current position of the gate of the valve is stored in advance for each class of the valves, the characteristic pumping rate ($Sp=f_1(P_2)$) of the vacuum pump at preset pressure is stored in advance for each class of the vacuum pumps, and the current predicted outflow rate Qo(n) at which gas is discharged from the process chamber is calculated, thereby affording the advantage of being able to accurately accommodate various combinations of valves and vacuum pumps.

Additionally, in the aforedescribed manner, according to the present invention, the setting means can switch the inputted characteristic pumping rate ($Sp=f_1(P_2)$) of the vacuum pump in accordance with the class of the vacuum pump, and switch the inputted characteristic conductance ($Cv=f_2(\theta)$) of the valve at the opening/closing angle ($\theta$) associated with the current position of the gate of the valve in accordance with the class of the vacuum pump, thereby affording the advantage of being able to make accurate settings appropriate to various combinations of valves and vacuum pumps, and to do so easily and quickly.

DESCRIPTION OF THE PREFERRED EMBODIMENTS

Figure 1:
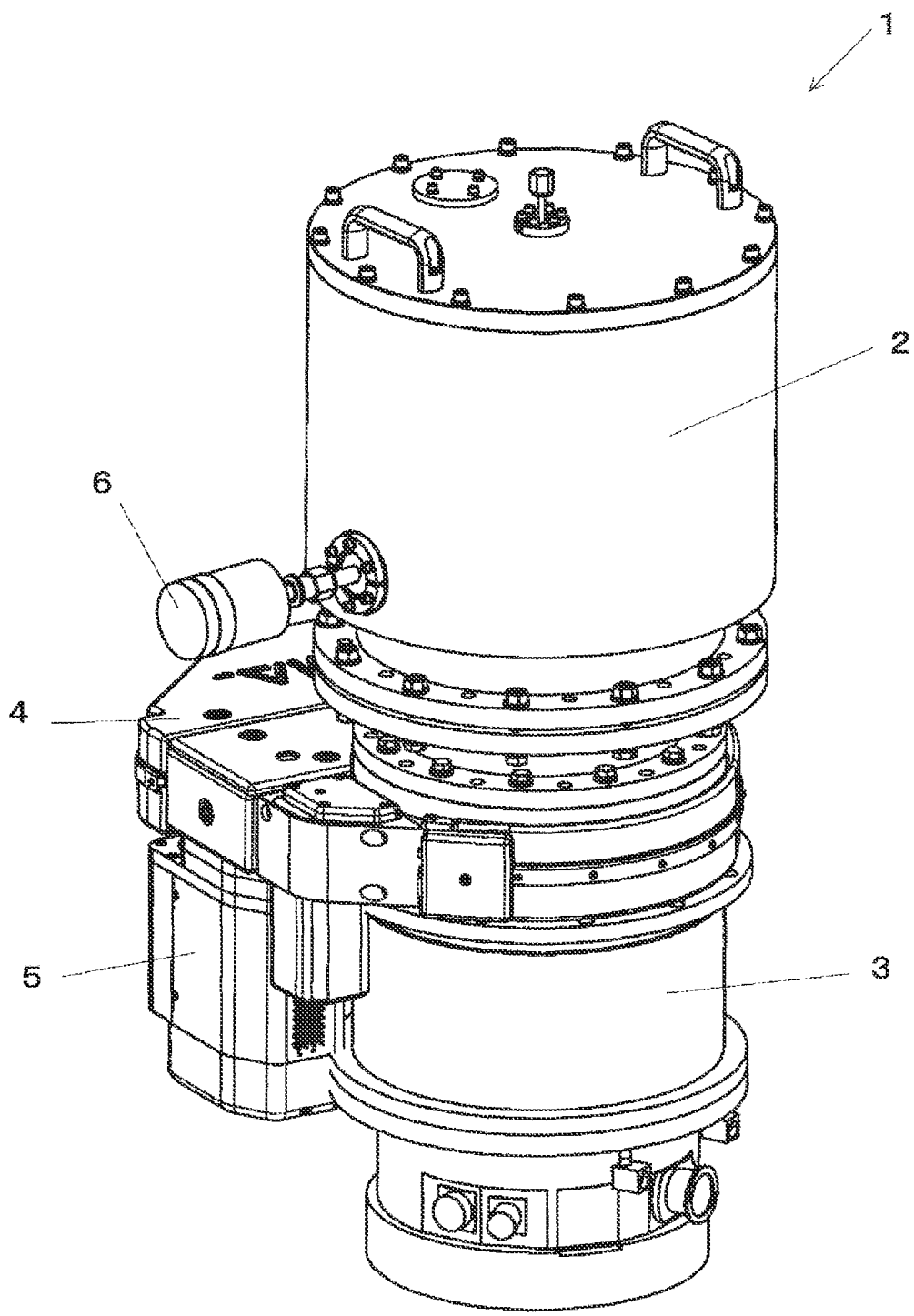
FIG. 1 is a perspective view of a semiconductor production device equipped with the pressure control device of the present invention.
Figure 2:
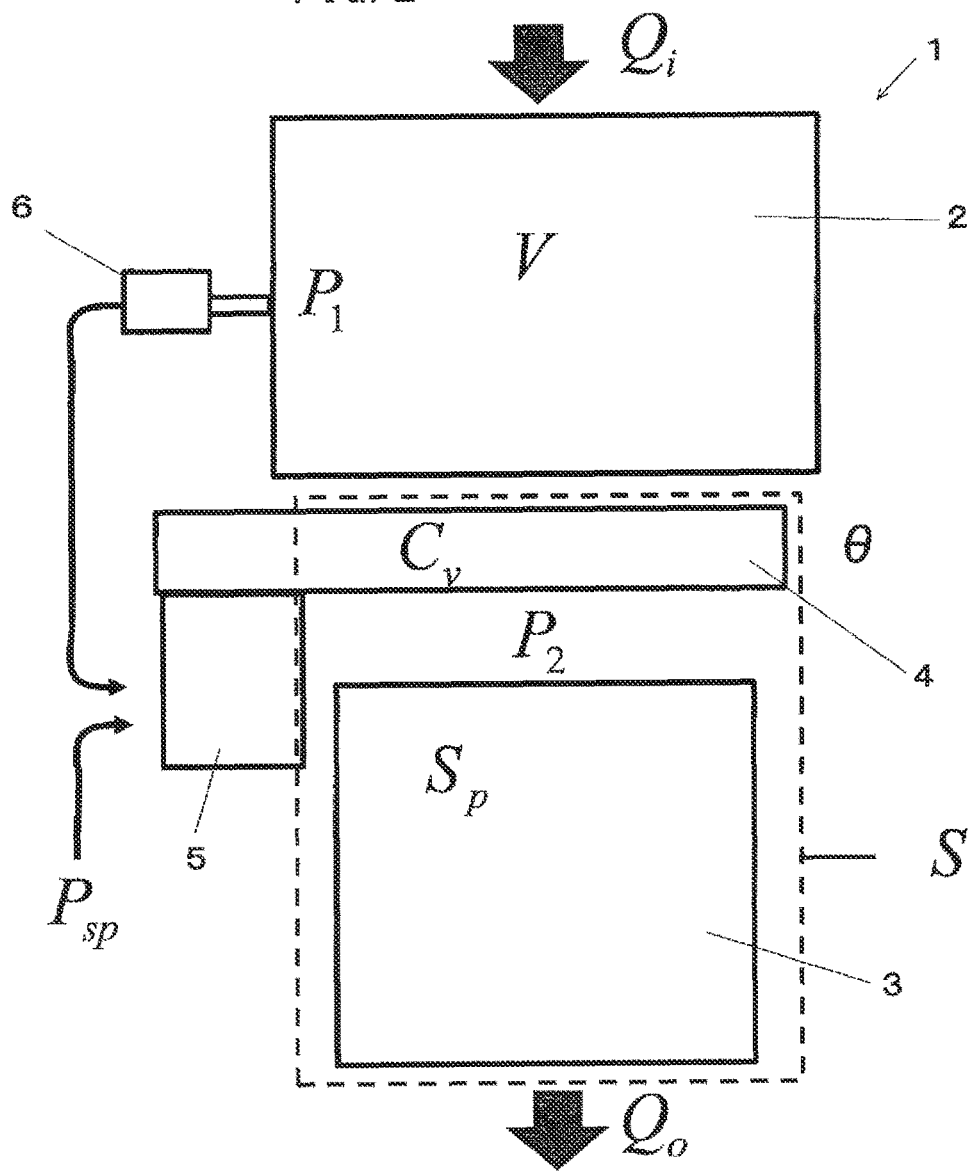
FIG. 2 is a conceptual diagram of a semiconductor production device equipped with the pressure control device of the present invention.

Preferred embodiments for carrying out the present invention will be discussed in detail while making reference to the drawings. FIGS. 1 and 2 show a semiconductor production device 1 equipped with a pressure control device 10 for carrying out the pressure control method of the present invention. This semiconductor production device 1 is provided with a process chamber 2 used in a semiconductor production step, a vacuum pump 3 for suctioning gas within the process chamber 2, a valve 4 situated between the process chamber 2 and the vacuum pump 3, and a controller 5 attached to the valve 4, for controlling the valve 4.

With this semiconductor production device 1, after semiconductor wafers, not illustrated, have been placed within the process chamber 2, source gas is introduced into the process chamber 2, and with the process chamber 2 interior regulated to a preset target pressure (pressure setpoint) through opening or closing of the valve 4, the valve 4 is then closed to seal the process chamber 2, and a preset process is performed. A pressure sensor 6 for measuring the pressure within the process chamber 2 is attached to the process chamber 2, and the pressure of the gas within the process chamber 2 is constantly monitored by this pressure sensor 6.

(1. Valve)

A horizontal rotary gate valve in which the plate swings in a horizontal direction within a casing is employed as the valve 4, due to advantages in terms of space, and relative ease of production. However, provided that the pressure within the process chamber 2 can be regulated appropriately, there is no limitation as to the design of the valve, and a pendulum valve, butterfly valve, poppet valve, or other vacuum valve could be used as well. Moreover, the design is not limited to one in which an O-ring slides against the casing during lifting and lowering of the plate of valve, and a greaseless valve design in which the plate is lifted and lowered within a casing of the valve such as a bellows, by a lifting/lowering member which is contactless with respect to the casing as a bellows, could be used as well. In this case, the process chamber 2 interior can be sealed by bringing the plate into close contact against the casing by a magnet (not illustrated).

(2. Controller)

Figure 3:
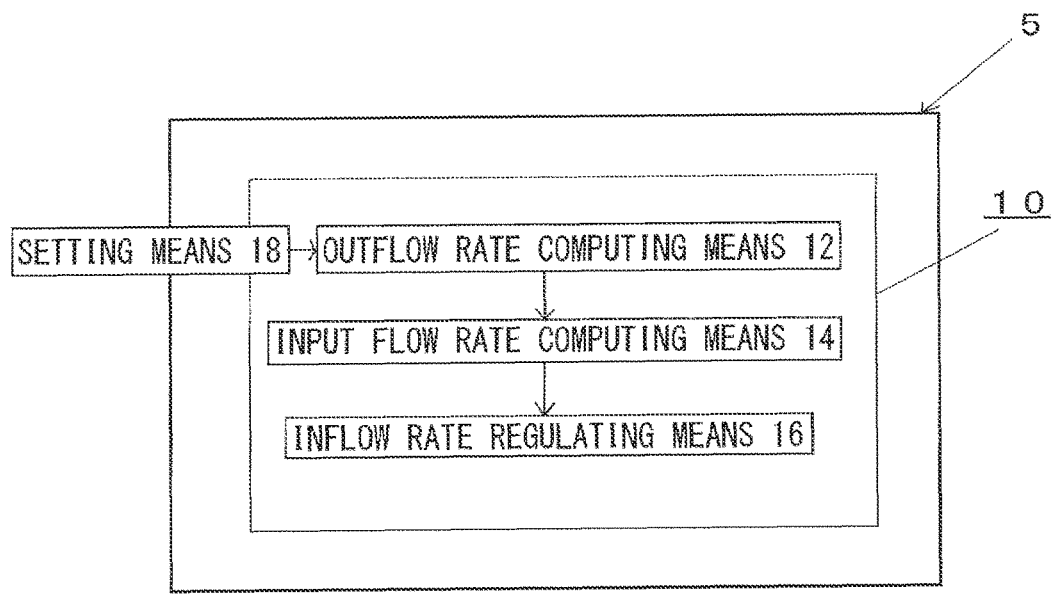
FIG. 3 is a conceptual diagram of the pressure control device of the present invention.

The controller 5 controls the operation, i.e. opening, closing, and the like, of the valve 4. As shown in FIG. 3, the pressure control device 10 of the present invention is set in the controller 5. By displacing the valve 4 to a preset position to regulate the opening thereof, the pressure control device 10 controls the pressure of gas within the process chamber 2 to a target pressure (pressure setpoint). Specifically, as shown in FIG. 3, this pressure control device 10 is provided with an outflow rate computing means 12 for computing a predicted outflow rate (Qo) at which gas is discharged from the process chamber 2 via the vacuum pump 3 by the suction of the vacuum pump 3; an input flow rate computing means 14 for calculating an input flow rate (Qi) at which it is necessary for gas to flow into the process chamber 2 in order to reach the target pressure; and an inflow rate regulating means 16 for regulating the inflow rate of gas inflowing to the process chamber 2, doing so on the basis of the input flow rate (Qi) calculated by the input flow rate computing means 14.

(3. Input Flow Rate Computing Means)

Specifically, the input flow rate computing means 14, using a known volume (V) of the process chamber and a pressure change rate ($\Delta P/\Delta t$) obtained from the current pressure ($P_1$: the unit is mTorr) within the process chamber 2, as measured by the pressure sensor 6, to reach a preset target pressure (Psp: the unit is mTorr) within the process chamber 2, which rate is derived from the differential between the current pressure ($P_1$) and the target pressure (Psp), calculates the input flow rate (Qi: the unit is m Torr·L/s) at which it is necessary for gas to flow into the process chamber 2 in order to reach the target pressure (Psp), doing so on the basis of the expression $Qi=Qo+(P/\Delta t)V$, where Qo (the unit is mTorr·L/s) is the pumping rate from the vacuum pump 3.

In doing so, it is taken note of the fact that in the fluid system of the semiconductor production device 10, as a fundamental rule, the pressure change rate ($\Delta P/\Delta t$) is derived from the gas inflow rate (Qi), the gas outflow rate (Qo), and the volume (V) of the process chamber 2 by the expression $\Delta P/\Delta t=(Qi-Qo)/V$, which is then transformed into an expression for deriving the input flow rate (Qi), to arrive at $Qi=Qo+(\Delta P/\Delta t)V$. In this case, the current pressure ($P_1$) within the process chamber 2 is measured by the pressure sensor 6 and is known, while at the same time, the target pressure (Psp) has been set beforehand as the pressure setpoint, and therefore the pressure change rate ($\Delta P/\Delta t$) obtained from the current pressure ($P_1$) to reach the target pressure (Psp) can be calculated from this data. Moreover, because the volume (V) of the process chamber 2 is a known value for each maker and model, this [information] can be utilized as data as well. Consequently, once the current gas outflow rate (Qo) is known, the inflow rate (Qi) of gas estimated to bring the process chamber 2 interior to the target pressure (Psp) can be calculated.

(4. Outflow Rate Computing Means)

Figure 5:
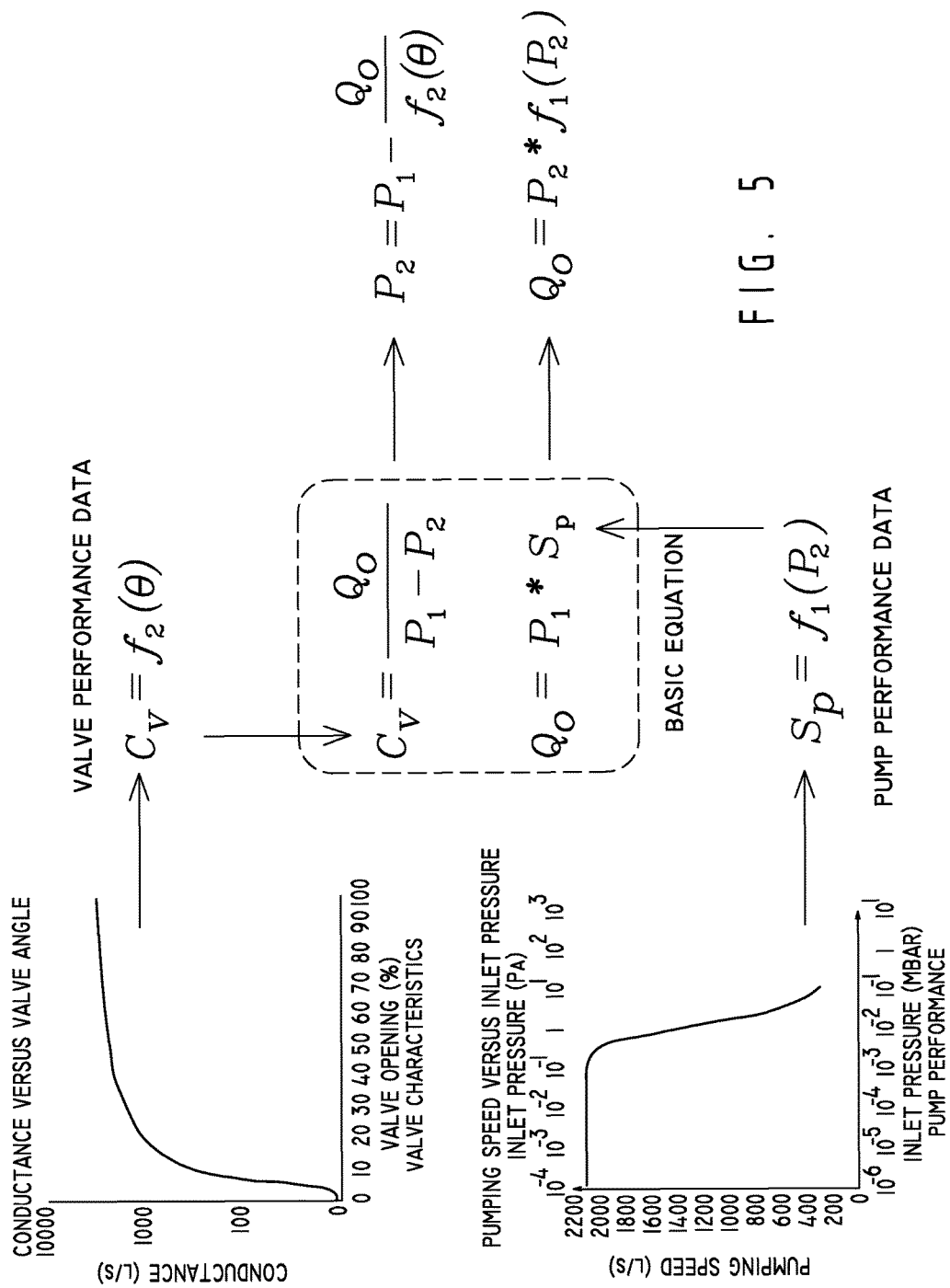
FIG. 5 is a diagram showing functions employed in the course of calculating the current predicted outflow rate at which gas is discharged from the process chamber, in the pressure control method of the present invention.
Figure 6:
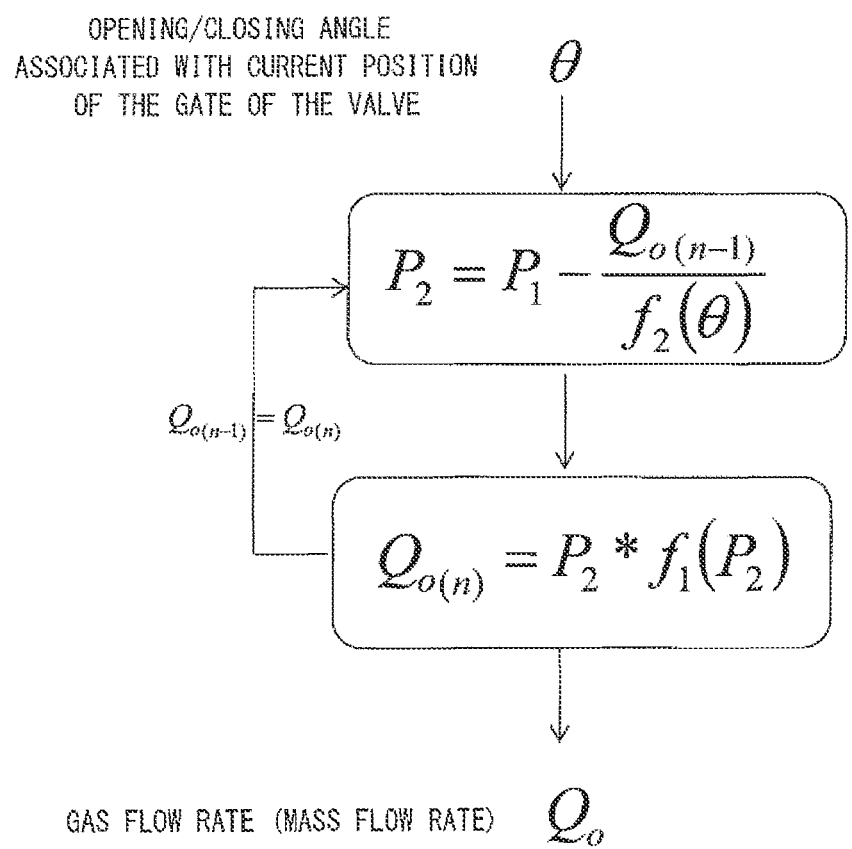
FIG. 6 is diagram showing functions employed in the course of feedback of the calculated current predicted outflow rate at which gas is discharged from the process chamber, to calculate the current pressure within the vacuum pump, in the pressure control method of the present invention.
Figure 7:
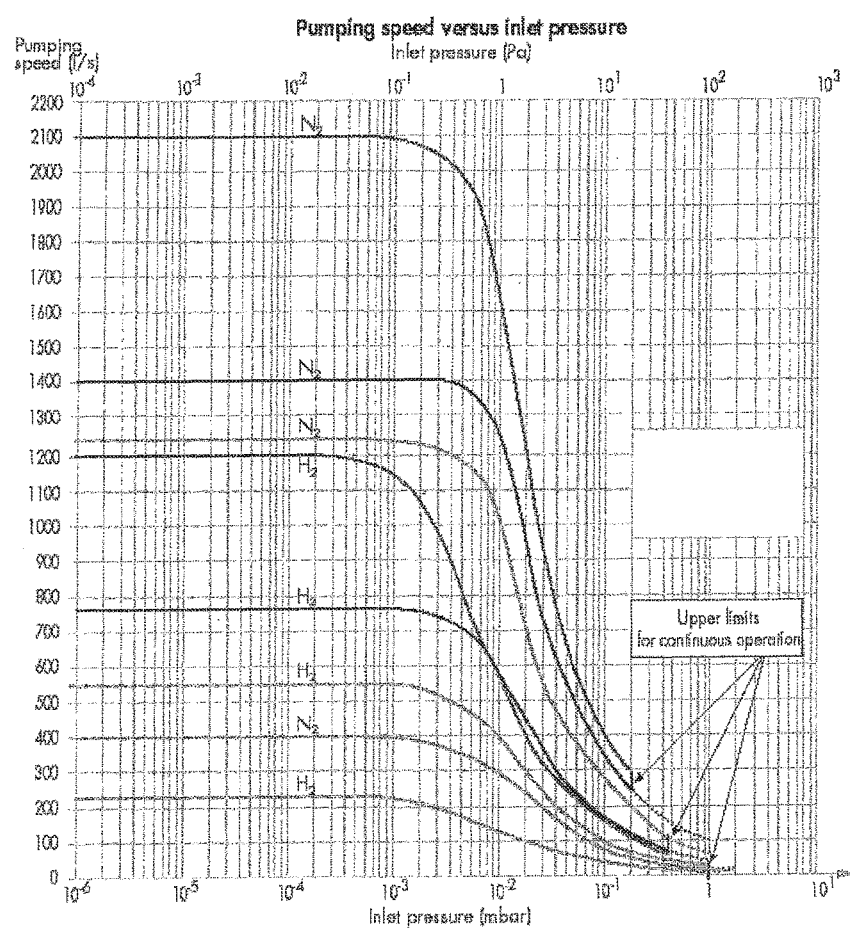
FIG. 7 is a graph showing a characteristic pumping rate at preset pressure, of each class of the vacuum pumps employed in the present invention.

The outflow rate computing means 12 is responsible for calculating the current outflow rate (Qo) of gas. Specifically, the outflow rate computing means 12 derives the current predicted outflow rate Qo(n) at which gas is discharged from the process chamber 2, from the current pressure ($P_2$: the unit is mTorr) within the vacuum pump 3 and the known characteristic pumping rate (Sp: the unit is L/s) of the vacuum pump 3 under preset pressure. For gas such as source gas and the like, in cases in which this flow rate thereof is ascertained in terms of a mass flow rate, the rate can be ascertained as flow rate (Q)=pressure (P)*volume flow rate (pumping rate: S), i.e., Q=PS, as shown in FIG. 6; accordingly, the rate is affected by the pressure ($P_2$) within the vacuum pump 3 on the discharge side, and moreover the flow rate is known to actually change in the manner shown in FIG. 5 and FIG. 7, due to pressure within the vacuum pump 3. Therefore, as shown by the example in FIG. 7, a known characteristic pumping rate (Sp) for each of the vacuum pumps 3 under preset pressure is derived as $Sp=f_1(P_2)$, from the graph showing the example of FIG. 7.

Figure 4:
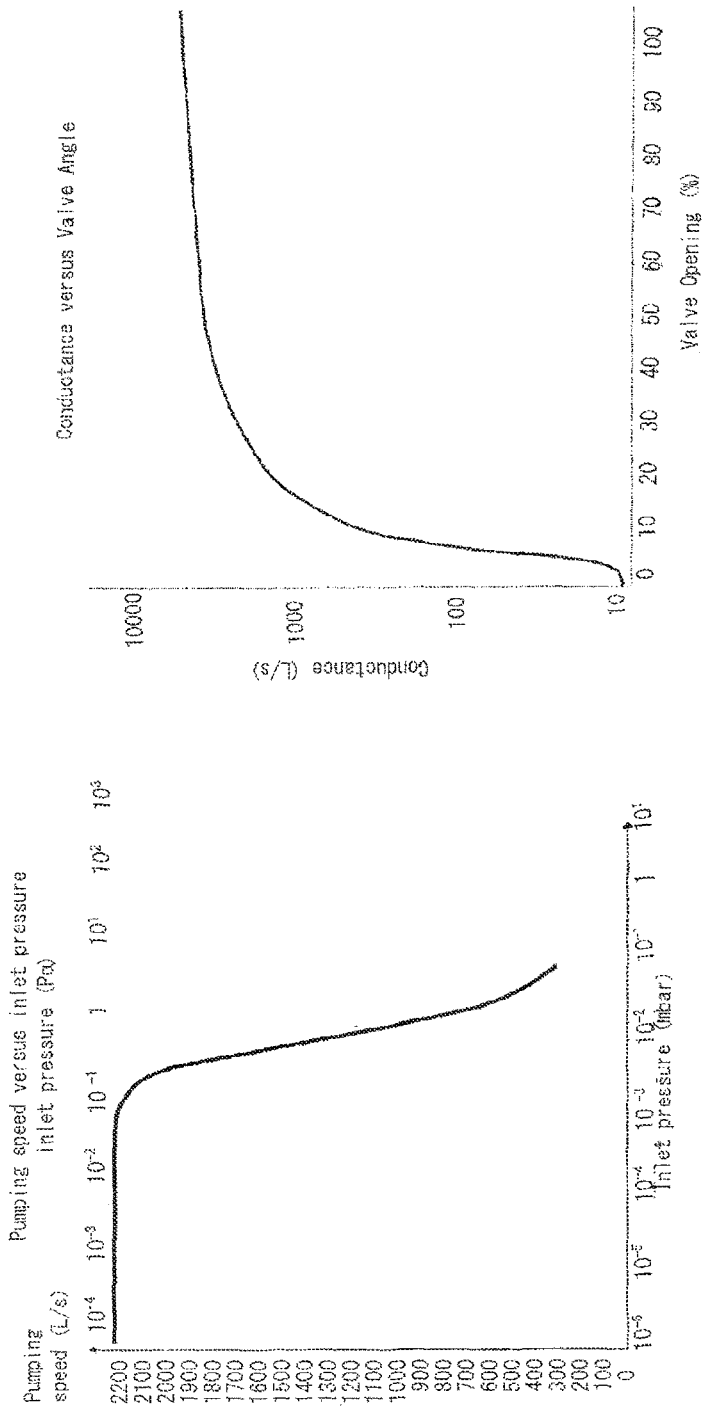
FIG. 4 is a graph showing function curves in an example of a characteristic pumping rate, under preset pressure, of a vacuum pump employed in the present invention, and of a characteristic conductance of a valve at the opening/closing angle ($\theta$) associated with the current position of the gate of the valve.

As shown in FIG. 6, the current predicted outflow rate Qo(n) at which gas is discharged from the process chamber 2 via the vacuum pump 3 is derived by substituting the aforedescribed function $Sp=f_1(P_2)$ into the aforedescribed expression Q=PS, i.e. for Sp in the expression $Qo=P_2*Sp$ for the problematic outflow rate from the vacuum pump 3 side. Specifically, as shown in FIG. 4, the outflow rate computing means 12 calculates the current outflow rate Qo(n) at which gas is discharged from the vacuum pump 3 side, in terms of the expression $Qo(n)=P_2*f_1(P_2)$, from the aforedescribed known pumping rate ($Sp=f_1(P_2)$) of each of the vacuum pump 3. Consequently, once the current pressure ($P_2$) within the vacuum pump 3 is known, the current predicted outflow rate (Qo(n)) at which gas is discharged from the process chamber 2 can be calculated.

In this case, according to the present invention, the outflow rate computing means 12 calculates the current pressure ($P_2$) within the vacuum pump 3 in the following manner. Specifically, as shown in FIG. 5, the characteristic conductance of the valve 4 is physically determined beforehand, by the opening/closing angle (θ) at a given position of the gate of the valve 4. The conductance Cv associated with a given aperture (θ) of the valve 4 is governed by factors such as the opening of the valve 4, the diameter of the gate, and the like, and is a known value for each maker and model. A functional curve $Cv=f_2(θ)$ can be derived as shown in FIG. 5, and utilized as data.

Meanwhile, as shown in FIG. 6, note is taken of the fact that the conductance Cv (the unit is L/s) of the valve 4 is given by the outflow rate (Qo), the pressure ($P_1$) within the process chamber 2, and the pressure ($P_2$) within the vacuum pump 3, by the expression $Cv=Qo/(P_1-P_2)$, which is then transformed to $P_2=P_1-(Qo/Cv)$ as an expression for deriving the pressure ($P_2$) within the vacuum pump 3. Then, as shown in FIG. 5, by specifying the opening/closing angle (θ) associated with the current position of the gate of the valve 4, to thereby substitute the known characteristic conductance ($Cv=f_2(θ)$) of the valve 4 at the opening/closing angle (θ) associated with the current position of the gate of the valve 4, for the Cv (the conductance of the valve 4) in this numerical expression, the current pressure ($P_2$) of gas within the vacuum pump 3 is calculated from $P_2=P_1-(Qo(n-1)/f_2(θ))$. By substituting the current pressure ($P_2$) of gas within the vacuum pump 3 calculated in this fashion for $P_2$ in the aforedescribed expression $Qo(n)=P_2*f_1(P_2)$ (both the terms "$P_2$" and $f_1$"$P_2$"), the outflow rate computing means 12 can calculate the current predicted outflow rate (Qo(n)) at which gas is discharged from the process chamber 2, as shown in FIG. 4.

In this case, as shown in FIG. 4, the outflow rate computing means 12 feeds back the calculated current predicted outflow rate Qo(n) of gas, through re-input thereof in the form of the term Qo(n−1) in the aforedescribed expression $P_2=P_1(Qo(n-1)/f_2(θ))$, and further substitutes the thusly calculated $P_2$ for the terms $P_2$ and $f_1(P_2)$ in the expression $Qo(n)=P_2*f_1(P_2)$, in order to calculate the current predicted outflow rate Qo(n) of gas. The input flow rate computing means 14 constantly calculates the input flow rate (Qi) at which it is necessary for gas to flow into the process chamber 2 to reach the target pressure (Psp), according to change in the current pressure ($P_2$) within the vacuum pump 3, doing so on the basis of the current predicted outflow rate Qo(n) calculated by the outflow rate computing means 12. In so doing, the input flow rate (Qi) at which it is necessary for gas to flow into the process chamber 2 to reach the target pressure can be correctly calculated, and the gas pressure within the process chamber 2 accurately controlled to the preset target value (pressure setpoint), rapidly in a constant and instantaneous manner in response to changes in pressure.

In the illustrated embodiment, the current pressure ($P_2$) of gas within the vacuum pump 3 is derived through a function; the basis for doing so is that it is difficult for the pressure ($P_2$) within the vacuum pump 3 to be measured by a sensor, because the fins are rotating at high speed within the vacuum pump 3, and because, due to space considerations, it is difficult to situate a sensor inside the vacuum pump 3 due to the size of the sensor. However, there is no limitation to a process that relies on this function, and in cases in which pressure ($P_2$) within the vacuum pump 3 can be measured by a sensor, the current pressure ($P_2$) within the vacuum pump 3 could be derived through measurements made by a sensor situated in the vacuum pump 3.

(5. Inflow Rate Regulating Means)

In cases in which the input flow rate (Qi) has been calculated in this manner, as shown in FIG. 5, because the characteristic conductance ($Cv=f_2(θ)$) of the valve 4 associated with the opening/closing angle (θ) at a given position of the gate of the valve 4 is known, the inflow rate regulating means 16 will displace the gate (not illustrated) to a position equivalent to a preset opening/closing angle (θ), to obtain a specific conductance (Cv) necessary for the valve 4 to ensure the input flow rate (Qi), and control the pressure within the process chamber 2 to the target pressure (Psp).

(6. Setting Means)

In the aforedescribed embodiment, the outflow rate computing means 12 stores in advance, for each class of the valves 4 (each maker and model), the characteristic conductance ($Cv=f_2(θ)$) of the valve 4 at the opening/closing angle (θ) associated with the current position of the gate of the valve 4, and likewise stores in advance, for each class of the vacuum pumps 3 (each maker and model), the characteristic pumping rate ($Sp=f_1(P_2)$) of the vacuum pump 3 at preset pressure. In so doing, the need to operate the system once with dummy wafers make the system learn each combination of process chamber 2, vacuum pump 3, and valve 4, as well as to perform a reset each time that these combinations change, is obviated, whereby ample versatility is achieved, while at the same time accurately accommodating different combinations of valves 4 and vacuum pumps 3, without the need for time and labor to make settings before running the system.

In this case, as shown in FIG. 3, the controller 5 is further equipped with setting means 18 which can switch the class of valves 4 and vacuum pumps 3. In specific terms, the setting means 18 can be constituted by an interface, such as buttons, provided to the controller 5, whereby, simply by specifying the class of valve 4 and vacuum pump 3, the inputted characteristic pumping rate ($Sp=f_1(P_2)$) of the vacuum pump 3 can be switched in accordance with the class of the vacuum pump 3, and the inputted characteristic conductance ($Cv=f_2(\theta)$) of the valve 4 at the opening/closing angle ($\theta$) associated with the current position of the gate of the valve 4 can be switched in accordance with the class of valve 4. In so doing, accurate settings to accommodate different combinations of valves 4 and vacuum pumps 3 can be made easily and quickly.

(7. Method of Use)

Next, the method of use of the pressure control method of the present invention will be described. Firstly, by way of advance preparation, for each of the vacuum pumps 3 it is predicted will be used, employing data published by the maker of the vacuum pump 3 in question, the known characteristic pumping rate ($Sp=f_1(P_2)$) of the vacuum pump 3 in question at preset pressure is stored in the outflow rate computing means 12, doing so for each class of the vacuum pumps (each maker and model); and for each of the valves 4 it is predicted will be used, employing data published by the maker of the valve 4 in question, the known characteristic conductance ($Cv=f_2(\theta)$) of the valve 4 at the opening/closing angle ($\theta$) associated with the current position of the gate of the valve 4 in question is stored, doing so for each class of the valves 4 (each maker and model). The volume (V) of the process chamber 2 is also input to the outflow rate computing means 12. In cases in which a new model or vacuum pump 3 or valve 4 becomes available, or in cases of a change in the specs of a model, it is preferable to update or revise the data, so that the data stored in the outflow rate computing means 12 is always the latest version.

Next, in accordance with the class of the vacuum pump 3 and valve 4 for which settings are actually being made, the interface of the setting means 18 is used, to make settings for the vacuum pump 3 and the valve 4 in question through button operations or the like, and specify the inputted characteristic pumping rate (Sp) of the vacuum pump 3 at preset pressure, and the characteristic conductance (Cv) of the valve 4 at the opening/closing angle ($\theta$) associated with the current position of the gate of the valve 4. In this case, in the aforedescribed manner, appropriate parameters can be set simply by selecting the vacuum pump 3 and the valve 4 in question.

Thereafter, in cases of actual regulation of gas pressure within the process chamber to a preset target value (pressure setpoint), firstly, it is assumed, by way of an initial value, that the gate of the valve 4 is normally in a fully-closed state immediately before the need for pressure control arises. In this state, because there is no outflow of gas from the downstream side (the vacuum pump 3 side) (because the vacuum pump is not operating), the current predicted outflow rate (Qo(n)) of gas infinitely approximates "0," and therefore when the current pressure within the vacuum pump 3 is derived in the outflow rate computing means 12, as shown in FIG. 4, a hypothetical value of "0" is input for the term "Qo(n−1)" in the standard expression $P_2=P_1-Qo(n-1)/f_2(\theta)$ (i.e., $P_2=P_1$ in a so-called steady state, the value of $P_1$ measured at this stage being input as-is as $P_2$ into the various functions), the characteristic conductance ($Cv=f_2(\theta)$) of the valve 4 at the opening/closing angle ($\theta$) associated with the current position of the gate of the valve 4 is substituted into the term $f_2(\theta)$ in the same standard expression $P_2=P_1-Qo(n-1)/f_2(\theta)$, and the current gas pressure ($P_2$) within the vacuum pump 3 is calculated.

As shown in FIG. 4, the current gas pressure ($P_2$) within the vacuum pump 3 calculated in this manner is substituted by the outflow rate computing means 12 for the term "$P_2$" in the standard expression $Qo(n)=P_2*f_1(P_2)$ used to calculate the predicted outflow rate Qo(n) of gas discharged from the process chamber 2 via the vacuum pump 3 by the suction of the vacuum pump 3, to thereby calculate the current predicted outflow rate Qo(n) of gas discharged from the process chamber 2.

Further, the current predicted outflow rate Qo(n) of gas calculated in this manner, as well as the target pressure (Psp) set beforehand as the pressure setpoint, and the input volume (V) of the process chamber 2, are included in the calculation of the expression $Qi=Qo+(\Delta P/\Delta t)V$ by the input flow rate computing means 14, to calculate the input inflow rate (Qi) of gas estimated for the process chamber 2 interior to reach the target pressure (Psp).

In this case, as shown in FIG. 4, in the outflow rate computing means 12, the calculated current predicted outflow rate Qo(n) of gas is fed back through re-input in the form of the term Qo(n−1) in the aforedescribed expression $P_2=P_1(Qo(n-1)/f_2(\theta))$, and the thusly calculated $P_2$ is further substituted for the terms $P_2$ and $f_1(P_2)$ in the expression $Qo(n)=P_2*f_1(P_2)$ to calculate the predicted outflow rate Qo(n−1); and in the input flow rate computing means 14, the input flow rate (Qi) at which it is necessary for gas to flow into the process chamber 2 to reach the target pressure (Psp), according to change in the current pressure ($P_2$) within the vacuum pump 3, is calculated in a constantly corrected manner, doing so on the basis of the current predicted outflow rate Qo(n) calculated by the outflow rate computing means 12. In this case, with the time required by the loop as short as possible, in specific terms, about 5 msec (0.05 second), the input flow rate (Qi) at which it is necessary for gas to flow into the process chamber 2 to reach the target pressure can be calculated accurately, doing so rapidly in a constant and instantaneous manner in response to changes in pressure, controlling the gas pressure within the process chamber 2 to the target pressure (pressure setpoint).

On the basis of the thusly calculated input flow rate (Qi) at which it is necessary for gas to flow into the process chamber 2 to reach the target pressure, the inflow rate regulating means 16 displaces the gate (not illustrated) to a position equivalent to a preset opening/closing angle ($\theta$), so as to obtain a specific conductance (Cv) necessary for the valve 4 to ensure the input flow rate (Qi) as shown in FIG. 5, ($Cv=f_2(\theta)$), doing so through an inverse operation, since the specific conductance (Cv) of the valve 4 at the opening/closing angle ($\theta$) associated with a given position of the gate of the valve 4 is known. In so doing, the pressure within the process chamber is accurately controlled to the target pressure (Psp).

The present invention has a wide scope of application, in particular, to process chambers used in semiconductor device etching devices, or in CVD thin film processes or PVD, as well as in the manufacture of flat panel displays and the like.

What is claimed is:

1. A pressure control method for regulating the pressure of gas inside a process chamber in a semiconductor production step via a valve situated between the process chamber and a vacuum pump for suctioning gas from within the process chamber, wherein the method for controlling pressure in a process chamber is characterized in that a predicted outflow rate (Qo) at which gas is discharged from the process chamber via the vacuum pump by the suction of the vacuum pump is computed;

an input flow rate (Qi) at which it is necessary for gas to flow into the process chamber in order to reach a preset target pressure (Psp) within the process chamber is calculated on the basis of the expression $Qi=Qo+(\Delta P/\Delta t)V$ using a known volume (V) of the process chamber and a pressure change rate ($\Delta P/\Delta t$) obtained from the current pressure ($P_1$) within the process chamber to reach the target pressure (Psp), the rate being derived from the differential between the current pressure ($P_1$) and the target pressure (Psp); and when the pressure within the process chamber is controlled to the target pressure (Psp) by flowing inflow of the calculated input flow rate (Qi) into the process chamber, a current predicted outflow rate Qo(n) at which gas is discharged from the process chamber is calculated on the basis of the expression $Qo(n)=P_2*f_1(P_2)$, using a current pressure ($P_2$) within the vacuum pump and a known characteristic pumping rate ($Sp=f_1(P_2)$) of the vacuum pump under preset pressure, wherein the following terms used herein are defined as follows;

"$P_1$": the current gas pressure within the process pump;
"$P_2$": the current gas pressure within the vacuum chamber;
"$\Delta t$": a specific time increment;
"$\Delta P$": the change in pressure in a specific time increment;
"n": the discrete index of the term, for example "n" describes an instant in time and (n+1) describes the next instant in time; and
"$f_1$": the characteristic pumping speed at the pump as a function of pump inlet pressure.

2. The method for controlling pressure in a process chamber according to claim 1, wherein the method for controlling pressure in a process chamber is characterized in that the current pressure ($P_2$) within the vacuum pump is calculated using the expression $P_2=P_1(Qo(n-1)/f_2(\theta))$, from a known characteristic conductance ($Cv=f_2(\theta)$) of the valve at the opening/closing angle ($\theta$) associated with the current position of a gate of the valve; and the current predicted outflow rate Qo(n) at which gas is discharged from the process chamber is calculated, wherein the term "$f_2(\theta)$" used herein is defined as the characteristic conductance of the valve as a function at opening/closing angle ($\theta$).

3. The method for controlling pressure in a process chamber according to claim 2, wherein the method for controlling pressure in a process chamber is characterized in that the calculated current predicted outflow rate Qo(n) of gas is fed back by being re-inputted in the form of the term Qo(n−1) in the expression $P_2=P_1-(Qo(n-1)/f_2(\theta))$ used to derive the current pressure ($P_2$) within the vacuum pump; the P2 thusly calculated is then substituted for the terms $P_2$ and $f_1(P_2)$ in the expression $Qo(n)=P_2*f_1(P_2)$ used to derive the predicted current outflow rate of gas discharged from the process chamber, whereby the current predicted outflow rate Qo(n) of gas is calculated; and the input flow rate (Qi) at which it is necessary for gas to flow into the process chamber to reach the target pressure (Psp) is calculated constantly, according to change in the current pressure ($P_2$) within the vacuum pump.

4. The method for controlling pressure in a process chamber according to claim 1, wherein the method for controlling pressure in a process chamber is characterized in that the current pressure ($P_2$) within the vacuum pump is derived through measurements made by a sensor situated in the vacuum pump.

5. The method for controlling pressure in a process chamber according to claim 2, wherein the method for controlling pressure in a process chamber is characterized in that the gate is displaced to a position equivalent to a preset opening/closing angle ($\theta$), to obtain a specific conductance (Cv) necessary for the valve to ensure the input flow rate (Qi), and the pressure within the process chamber is controlled to the target pressure (Psp).

6. The method for controlling pressure in a process chamber according to claim 2, wherein the method for controlling pressure in a process chamber is characterized in that a characteristic conductance ($Cv=f_2(\theta)$) of the valve at the opening/closing angle ($\theta$) associated with the current position of the gate of the valve is stored in advance, for each class of the valves; a characteristic pumping rate ($Sp=f_1(P_2)$) of the vacuum pump at preset pressure is stored in advance, for each class of the vacuum pumps; and the current predicted outflow rate Qo(n) at which gas is discharged from the process chamber is calculated.

7. The method for controlling pressure in a process chamber according to claim 6, wherein the method for controlling pressure in a process chamber is characterized in that the inputted characteristic pumping rate ($Sp=f_1(P_2)$) of the vacuum pump is switched in accordance with the class of the vacuum pump, and the inputted characteristic conductance ($Cv=f_2(\theta)$) of the valve at the opening/closing angle ($\theta$) associated with the current position of the gate of the valve is switched in accordance with the class of the valve.

8. The method for controlling pressure in a process chamber according to claim 1, wherein the method for controlling pressure in a process chamber is characterized in that the valve is a vacuum valve such as a gate valve, pendulum valve, butterfly valve, or poppet valve.

9. The method for controlling pressure in a process chamber according to claim 1, wherein the method for controlling pressure in a process chamber is characterized in that the valve is a greaseless valve in which the gate is lifted and lowered, within a casing of the valve such as a bellows, by a lifting/lowering member which is contactless with respect to the casing.

10. A device for controlling pressure in a process chamber, the device regulating the pressure of gas inside a process chamber in a semiconductor production step, via a valve situated between the process chamber and a vacuum pump for suctioning gas from within the process chamber, the device for controlling pressure in a process chamber characterized by comprising:

outflow rate computing means for computing a predicted outflow rate (Qo) at which gas is discharged from the process chamber via the vacuum pump by the suction of the vacuum pump;

input flow rate computing means for calculating, on the basis of the expression $Qi=Qo+(\Delta P/\Delta t)V$, an input flow rate (Qi) at which it is necessary for gas to flow into the process chamber in order to reach a preset target pressure (Psp) within the process chamber, from a known volume (V) of the process chamber and a pressure change rate ($\Delta P/\Delta t$) obtained from the current pressure ($P_1$) within the process chamber to reach the target pressure (Psp), the rate being derived from the differential between the current pressure ($P_1$) and the target pressure (Psp); and inflow rate regulating means for regulating the inflow rate at which gas is to flow into the process chamber, to the input flow rate (Qi) calculated on the basis of the input flow rate computing means; and when the pressure within the process chamber is controlled to the target pressure (Psp) by flowing inflow of the calculated input flow rate (Qi) into the process chamber, the outflow rate computing means calculates, on the basis of the expression $Qo(n)=P_2*f_1(P_2)$, a current predicted outflow rate $Qo(n)$ at which gas is discharged from the process chamber, from current pressure ($P_2$) within the vacuum pump and a known characteristic pumping rate ($Sp=f_1(P_2)$) of the vacuum pump under preset pressure, wherein the following terms used herein are defined as follows;

"$P_1$": the current gas pressure within the process pump;

"$P_2$": the current gas pressure within the vacuum chamber;

"$\Delta t$": a specific time increment;

"$\Delta P$": the change in pressure in a specific time increment;

"n": the discrete index of the term, for example "n"($\theta$) describes an instant in time and (n+1) describes the next instant in time; and "$f_1$": the characteristic pumping speed at the pump as a function of pump inlet pressure.

11. The device for controlling pressure in a process chamber according to claim 10, wherein the device for controlling pressure in a process chamber is characterized in that the outflow rate computing means calculates the current pressure ($P_2$) within the vacuum pump by the expression $P_2=P_1-(Qo(n-1)/f_2(\theta))$, from a known characteristic conductance ($Cv=f_2(\theta)$) of the valve at the opening/closing angle ($\theta$) associated with the current position of the gate of the valve, and calculates the current predicted outflow rate $Qo(n)$ at which gas is discharged from the process chamber, wherein the term "$f_2(\theta)$" used herein is defined as the characteristic conductance of the valve as a function at opening/closing angle ($\theta$).

12. The device for controlling pressure in a process chamber according to claim 11, wherein the device for controlling pressure in a process chamber is characterized in that the outflow rate computing means feeds back the calculated current predicted outflow rate $Qo(n)$ of gas through re-inputting thereof in the form of the term $Qo(n-1)$ in the expression $P_2=P_1-(Qo(n-1)/f_2(\theta))$; and then substitutes the thusly calculated $P_2$ for the terms $P_2$ and $f_1(P_2)$ in the expression $Qo(n)=P_2*f_1(P_2)$, in order to calculate the current predicted outflow rate $Qo(n)$ of gas; and the input flow rate computing means constantly calculates the input flow rate (Qi) at which it is necessary for gas to flow into the process chamber to reach the target pressure (Psp), according to change in the current pressure ($P_2$) within the vacuum pump, doing so on the basis of the current predicted outflow rate $Qo(n)$ calculated by the outflow rate computing means.

13. The device for controlling pressure in a process chamber according to claim 10, wherein the device for controlling pressure in a process chamber is characterized in that the outflow rate computing means derives the current pressure ($P_2$) within the vacuum pump through measurements made by a sensor situated in the vacuum pump.

14. The device for controlling pressure in a process chamber according to claim 11, wherein the device for controlling pressure in a process chamber is characterized in that the inflow rate regulating means displaces the gate to a position equivalent to a preset opening/closing angle ($\theta$), to obtain a specific conductance (Cv) necessary for the valve to ensure the input flow rate (Qi), and controls the pressure within the process chamber to the target pressure (Psp).

15. The device for controlling pressure in a process chamber according to claim 11, wherein the device for controlling pressure in a process chamber is characterized in that the outflow rate computing means stores in advance, for each class of the valves, a characteristic conductance ($Cv=f_2(\theta)$) of the valve at the opening/closing angle ($\theta$) associated with the current position of the valve gate; stores in advance, for each class of the vacuum pumps, a characteristic pumping rate ($Sp=f_1(P_2)$) of the vacuum pump at preset pressure; and calculates the current predicted outflow rate $Qo(n)$ at which gas is discharged from the process chamber.

16. The device for controlling pressure in a process chamber according to claim 15, wherein the device for controlling pressure in a process chamber is characterized by having setting means that can switch the inputted vacuum pump characteristic pumping rate ($Sp=f_1(P_2)$), in accordance with the class of the vacuum pump, and switch the inputted characteristic conductance ($Cv=f_2(\theta)$) of the valve at the opening/closing angle ($\theta$) associated with the current position of the gate of the valve, in accordance with the class of the valve.

17. The device for controlling pressure in a process chamber according to claim 10, wherein the device for controlling pressure in a process chamber is characterized in that the valve is a vacuum valve such as a gate valve, pendulum valve, butterfly valve, or poppet valve.

18. The device for controlling pressure in a process chamber according to claim 10, wherein the device for controlling pressure in a process chamber is characterized in that the valve is a greaseless valve in which the gate is lifted and lowered, within a casing of the valve such as a bellows, by a lifting/lowering member which is contactless with respect to the casing.

* * * * *

UNITED STATES PATENT AND TRADEMARK OFFICE
CERTIFICATE OF CORRECTION

PATENT NO. : 9,880,569 B2
APPLICATION NO. : 14/547752
DATED : January 30, 2018
INVENTOR(S) : Emmanuel Vyers et al.

It is certified that error appears in the above-identified patent and that said Letters Patent is hereby corrected as shown below:

In the Claims

Column 15, Line 27, being Line 44 of Claim 10, after "for example "n"", delete "(θ)".

Signed and Sealed this
Tenth Day of April, 2018

Andrei Iancu
*Director of the United States Patent and Trademark Office*